(12) United States Patent
Chen

(10) Patent No.: US 7,117,928 B2
(45) Date of Patent: Oct. 10, 2006

(54) HEAT SINKS FOR A COOLER

(75) Inventor: Chien-Yu Chen, Kaohsiung (TW)

(73) Assignee: Inventor Precision Co., Ltd., Kaohsiung (TW)

( * ) Notice: Subject to any disclaimer, the term of this patent is extended or adjusted under 35 U.S.C. 154(b) by 0 days.

(21) Appl. No.: 10/453,627

(22) Filed: Jun. 4, 2003

(65) Prior Publication Data

US 2004/0244947 A1 Dec. 9, 2004

(51) Int. Cl.
*F28D 15/00* (2006.01)
*H05K 7/20* (2006.01)

(52) U.S. Cl. ............... 165/80.3; 165/185; 165/104.34; 165/122; 361/697

(58) Field of Classification Search ............... 165/185, 165/80.3, 121, 122; 361/697, 704, 690, 694–695, 361/702–703; 257/706, 722; 174/16.3
See application file for complete search history.

(56) References Cited

U.S. PATENT DOCUMENTS

| | | | | |
|---|---|---|---|---|
| 5,132,780 A | * | 7/1992 | Higgins, III | 257/722 |
| 5,413,166 A | * | 5/1995 | Kerner et al. | 165/58 |
| 5,526,875 A | * | 6/1996 | Lin | 165/80.3 |
| 5,625,229 A | * | 4/1997 | Kojima et al. | 257/712 |
| 5,727,624 A | * | 3/1998 | Ko et al. | 165/121 |
| 6,313,399 B1 | * | 11/2001 | Suntio et al. | 174/17 VA |
| 6,333,852 B1 | * | 12/2001 | Lin | 361/697 |
| 6,370,025 B1 | * | 4/2002 | Yasufuku et al. | 361/704 |
| 6,596,039 B1 | * | 7/2003 | Lesieur | 48/61 |
| 6,643,129 B1 | * | 11/2003 | Fujiwara | 361/687 |
| 6,698,511 B1 | * | 3/2004 | DiBene et al. | 165/185 |
| 6,935,412 B1 | * | 8/2005 | Mueller | 165/80.4 |

FOREIGN PATENT DOCUMENTS

| | | | | |
|---|---|---|---|---|
| JP | 04269855 A | * | 9/1992 | |
| JP | 2001308232 A | * | 11/2001 | |
| JP | 20030101273 A | * | 4/2003 | |

* cited by examiner

*Primary Examiner*—Tho Duong
(74) *Attorney, Agent, or Firm*—Bacon & Thomas, PLLC

(57) ABSTRACT

A heat sink includes a base having a first side in contact with a heat-generating electronic element and a second side opposed to the first side. Fins are formed on the second side of the base. A non-rectilinear air channel is formed between two adjacent fins, with a length of the non-rectilinear air channel being greater than a length of the base along an extending direction of the fins on the base. The heat sink may be provided to an outlet side of a heat-dissipating fan to form a cooler.

20 Claims, 13 Drawing Sheets

HEAT SINKS FOR A COOLER

BACKGROUND OF THE INVENTION

1. Field of the Invention

The present invention relates to heat sinks for a cooler. In particular, the present invention relates to heat sinks for a cooler, wherein the heat sinks have a plurality of wavy or zigzag fins formed on a base, forming a non-rectilinear air channel between each two adjacent fins. The present invention also relates to coolers incorporating the heat sinks.

2. Description of Related Art

FIG. 12 illustrates a conventional cooler comprised of a heat-dissipating fan 100 and a heat sink. The heat sink includes a base 10 and a plurality of fins 11a formed on an upper side thereof, thereby defining a plurality of air channels 12a. The underside of the base 10 is secured to a heat-generating electronic element (not shown). The heat-dissipating fan 100 includes a metal casing 101 that is integrally formed with the base 10. A fan wheel 102 is mounted in the metal casing 101, and a lid or cover 110 is mounted to the casing 101. The fan wheel 102 includes a plurality of blades 104 for driving air into the casing 101 via an air inlet 111 in the cover 110. The air passes through the air channels 12a of the heat sink such that the fins 11a and the air channels 12a undergo heat exchange with the heat-generating electronic element. Although the integrally formed heat sink/heat-dissipating fan has a simple structure and thus suitable for compact electronic devices, the airflow for carrying the heat generated by the heat-dissipating fan is apt to quickly pass the respective rectilinear air channel 12a and thus fails to provide sufficient time for heat-exchange.

FIG. 13 illustrates another conventional heat sink disclosed in, e.g., Taiwan Utility Model Publication No. 524430. As shown in FIG. 13, the heat sink includes a base 10 on which a plurality of fins 11a are formed, providing a plurality of rectilinear air channels 12a. The fins 11a are of different heights to provide at least three peaks 13a, thereby increasing the overall heat-exchange area for the fins 11a. A heat-dissipating fan 20 is mounted on top of the heat sink to form a cooler. The wavy structure of the heat sink increases the overall height of the heat sink although the heat-dissipating efficiency is improved. As a result, the heat sink could not be used with miniature electronic devices. Further, the air flow for carrying the heat generated by the heat-dissipating fan is apt to quickly pass the respective rectilinear air channel 12a and thus fails to provide sufficient time for heat-exchange.

OBJECTS OF THE INVENTION

An object of the present invention is to provide a heat sink having a base and a plurality of fins formed on a side of the base. A non-rectilinear air channel is defined between two adjacent fins for increasing the time for heat-exchange while the air is passing through the air channel, thereby improving the heat-exchange efficiency.

SUMMARY OF THE INVENTION

To achieve the aforementioned objects, the present invention provides a heat sink having a base and a plurality of fins formed on a side of the base. A non-rectilinear air channel is defined between two adjacent fins for increasing the time for heat-exchange while the air is passing through the air channel, thereby improving the heat-exchange efficiency.

Each fin of the heat sink may be wavy or zigzag, and each fin of the heat sink may be continuous or discontinuous.

In an embodiment of the invention, a plurality of heat-dissipating pegs are provided in each air channel for increasing the overall heat-exchange area, thereby further improving the heat-exchange efficiency.

The heat sink may be provided to an outlet side of a heat-dissipating fan to form a cooler.

Other objects, advantages and novel features of this invention will become more apparent from the following detailed description when taken in conjunction with the accompanying drawings.

DETAILED DESCRIPTION OF THE PREFERRED EMBODIMENTS

Figure 1:
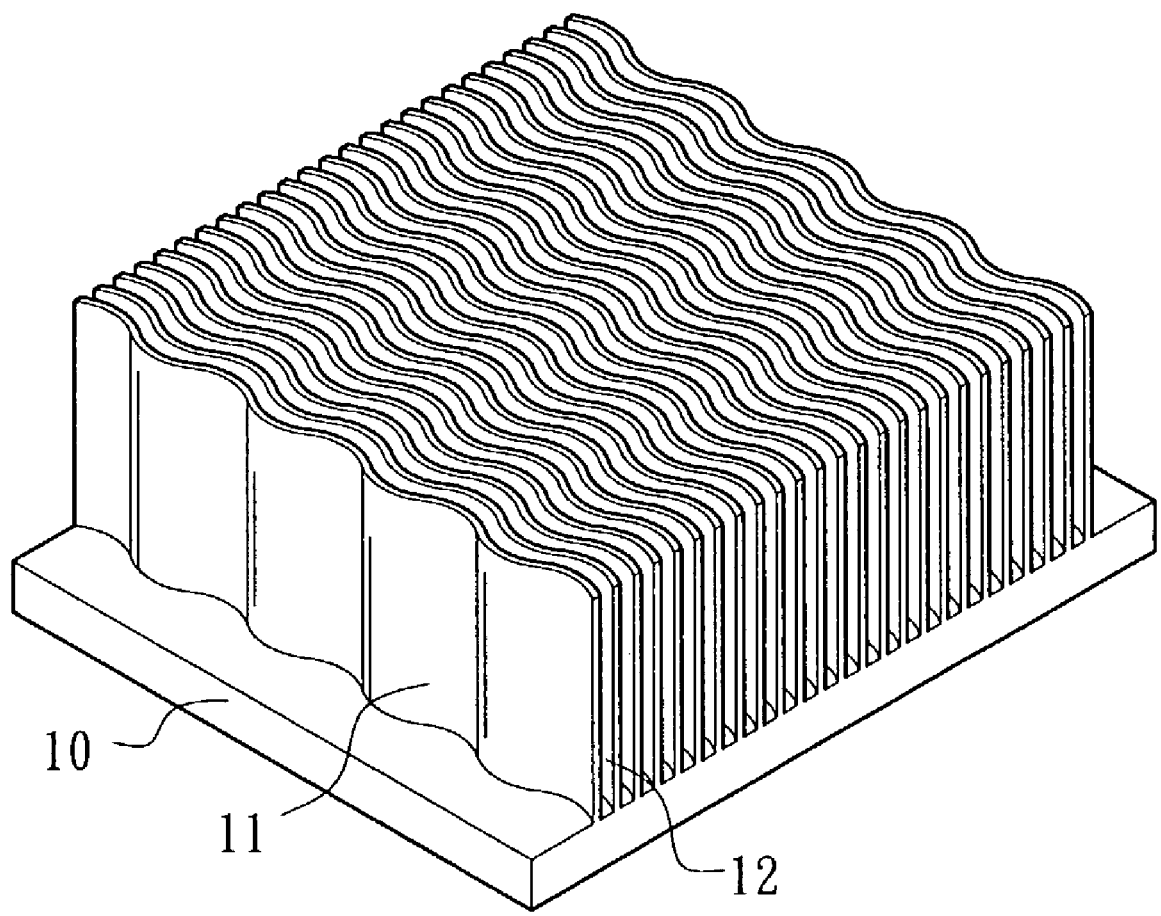
FIG. 1 is a perspective view of an embodiment of a heat sink in accordance with the present invention.

Preferred embodiments of the present invention are now to be described hereinafter in detail, in which the same reference numerals are used in the preferred embodiments for the same parts as those in the prior art to avoid redundant description.

Referring to FIG. 1, a heat sink of an embodiment of the present invention includes a base 10 and a plurality of fins 11 formed on a side (e.g., upper side) of the base 10. A non-rectilinear air channel 12 is defined between two adjacent fins 11. The heat sink is made of a heat-conductive material such as copper, aluminum, etc. An underside of the base 10 is in contact with a heat-generating electronic element (not shown). The fins 11 extend along a longitudinal direction or a lateral direction of the base. Preferably, the fins 11 are wavy to form a wavy air channel 12 between two adjacent fins 11. In this embodiment, the wavy fins 11 are continuous and parallel to each other. The wavy fins 11 are spaced at regular intervals or irregular intervals. It is noted that the overall length of each air channel 12 along the extending direction thereof is longer than the length of the heat sink. Thus, the overall heat-exchange area provided by the fins 11 is increased without increasing the height, length, or width of the heat sink.

Figure 2:
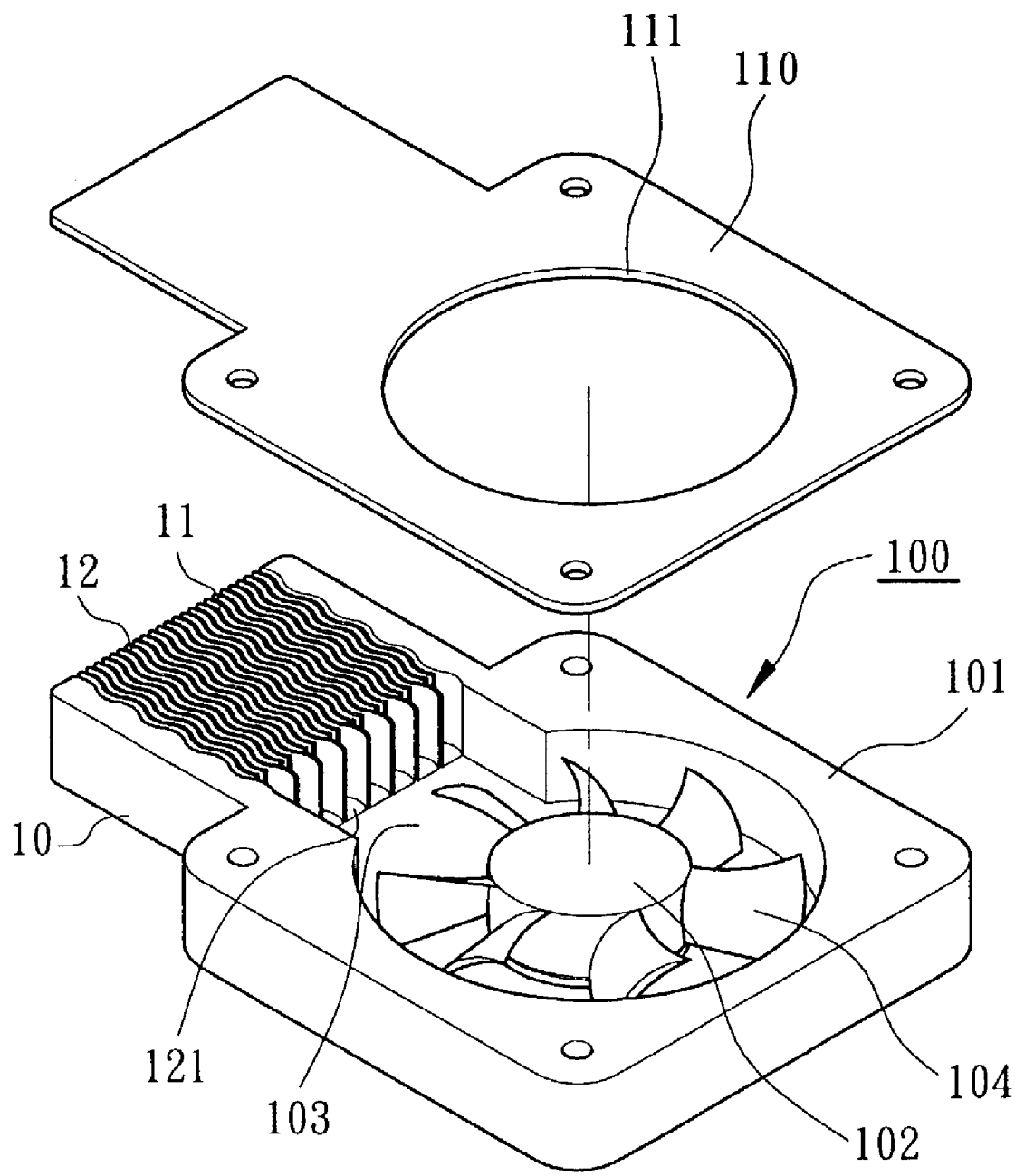
FIG. 2 is a perspective view, partly exploded, of a cooler incorporating the heat sink in FIG. 1.
Figure 3:
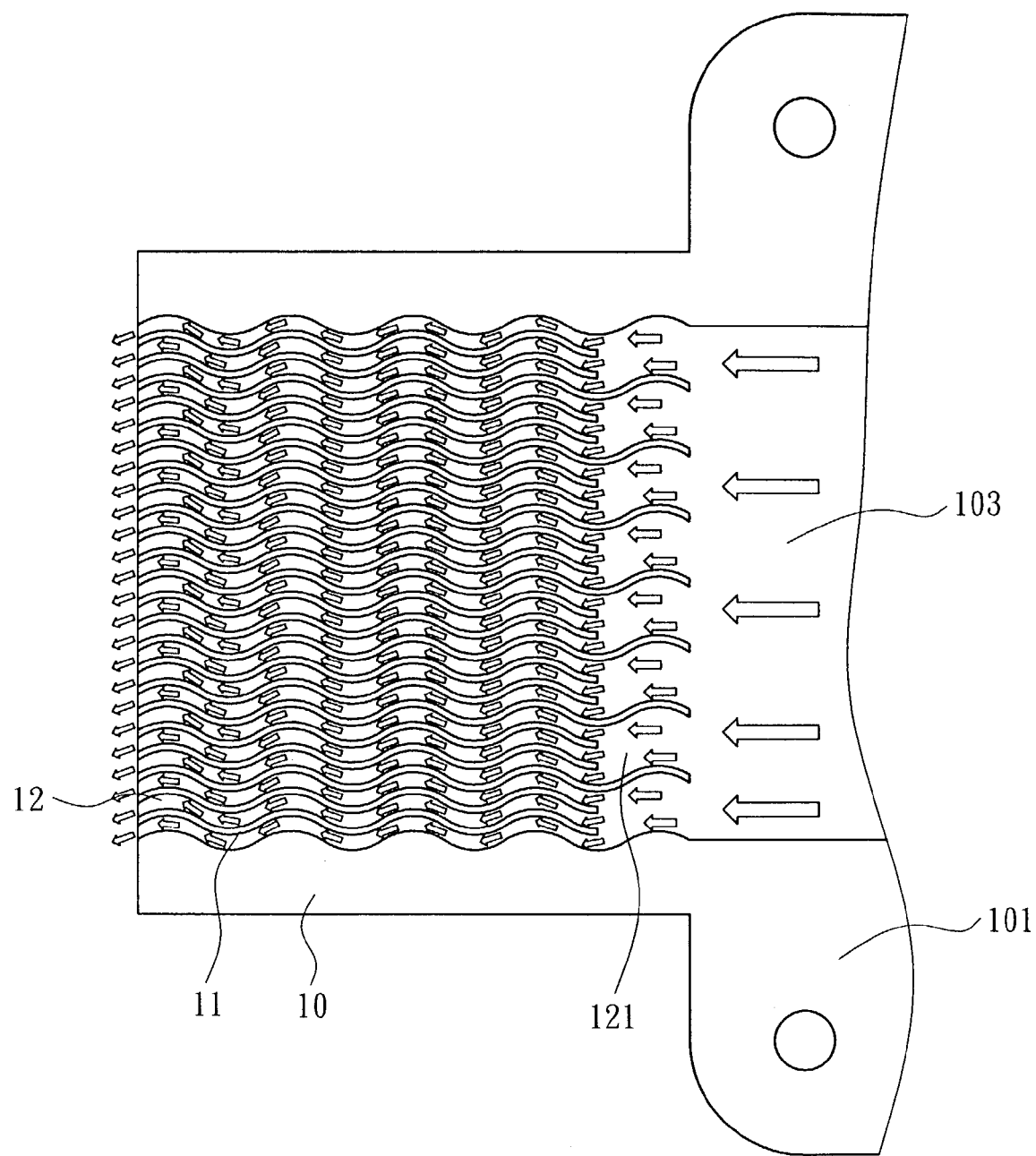
FIG. 3 is a schematic top view illustrating airflow of the cooler in FIG. 2.

Referring to FIGS. 2 and 3, the heat sink may be integrally formed on an outlet 103 side of a heat-dissipating fan 100, thereby forming a cooler. The underside of the base 10 is secured on a top face of a heat-generating element (not shown) for dissipating heat generated by the heat-generating element. The base 10 also includes a pair of opposing side walls having a non-flat surface, wherein the fins 11 are disposed between the opposing side walls. The heat-dissipating fan 100 includes a casing 101, a fan wheel 102, and an outlet 103. The fan wheel 102 is mounted in a recessed portion of the casing 101 and has a plurality of blades 104. Preferably, a lid 110 having an inlet 111 is mounted to the casing 10 to cover a top of the casing 101 and a top of the heat sink. When the heat-dissipating fan 100 turns, the blades 104 drive air into the casing 101 via the inlet 111 of the lid 110. The incoming air passes through the outlet 103 of the casing 101 into the air channels 12 of the heat sink and then exits the heat sink. Since the velocity of the air passing through the respective non-rectilinear air channel 12 (wavy channels in this embodiment) is slower than the case of passing through rectilinear air channels, the time for heat-exchange while the air is passing through the air channels 12 is increased. The heat-exchange efficiency for the airflow in the respective air channel 12 is effectively improved, resulting an improvement in the overall heat-exchange efficiency of the heat sink. Further, some of the fins 11 may be shorter than the remaining fins 11, forming at least one wider air guide section 121 adjacent to the outlet 103 of the casing 101, as shown in FIG. 3. Thus, the air flows more smoothly from the outlet 103 into the non-rectilinear air channels 12.

Figure 4:
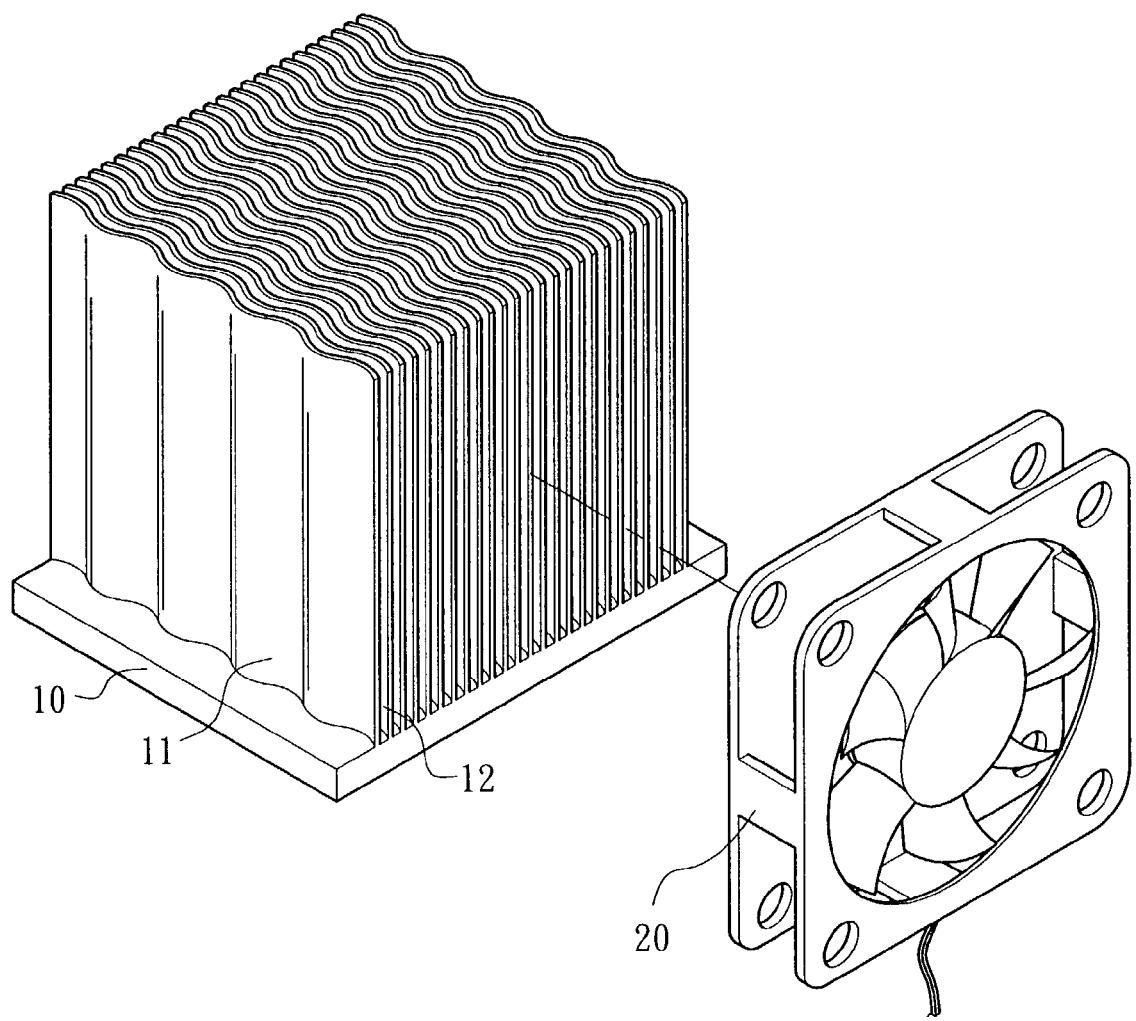
FIG. 4 is an exploded perspective view of a modified embodiment of the cooler, wherein the fan is attached to a side of the heat sink.

FIG. 4 illustrates a modified embodiment of the cooler in accordance with the present invention, wherein the heat-dissipating fan 20 is attached to a side of the fins 11 for driving air from an end of the respective air channel 12 through the other end of the respective air channel 12. The non-rectilinear air channels 12 allows sufficient heat-exchange between the fins 11 and the air passing through the air channels 12. The bending portions of the non-rectilinear air channels 12 retard the air and thus increase the time for air to pass through the air channels 12. The heat-exchange efficiency for the airflow in the respective air channel 12 is effectively improved, resulting an improvement in the overall heat-exchange efficiency of the heat sink.

Figure 5:
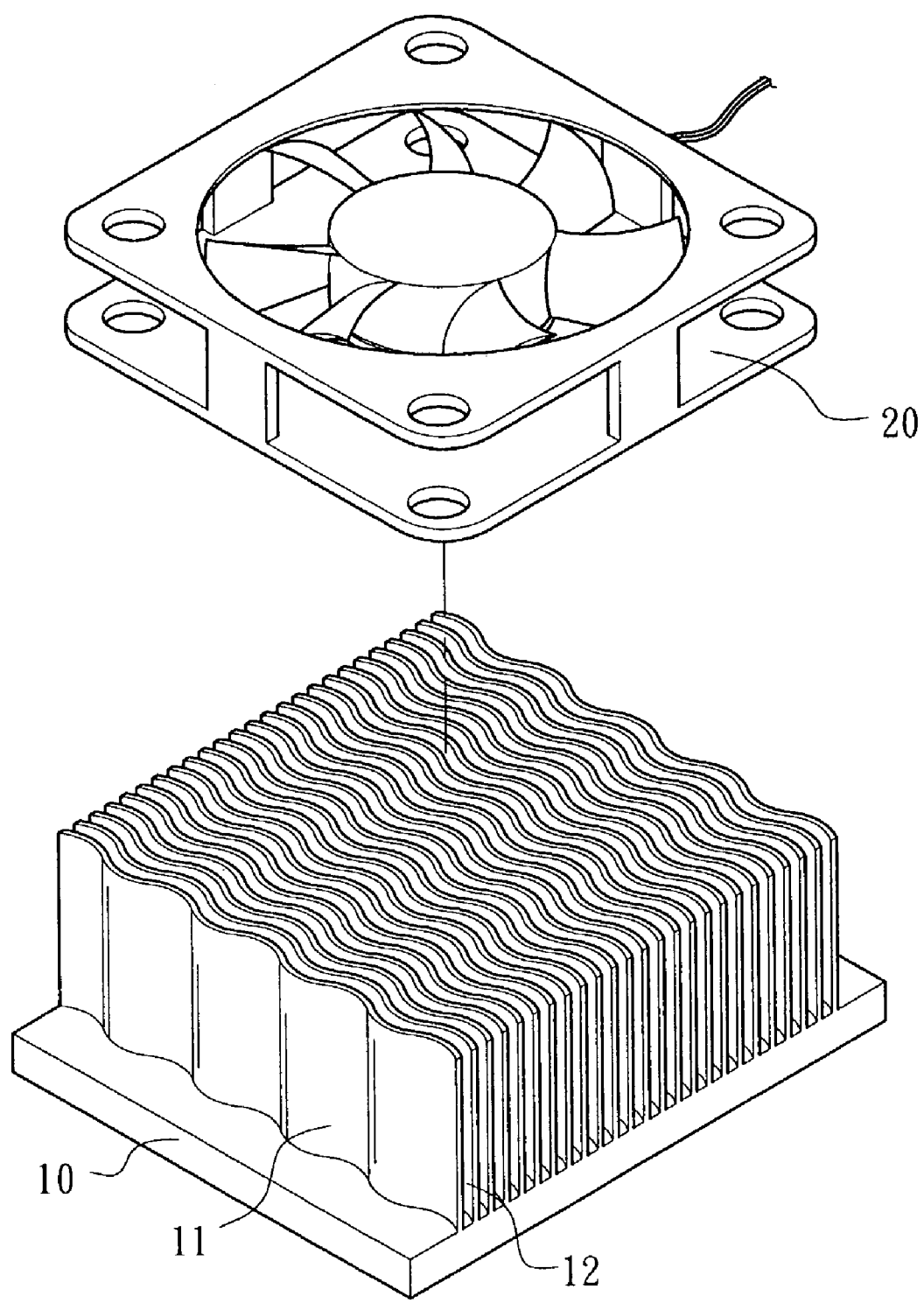
FIG. 5 is an exploded perspective view of another modified embodiment of the cooler, wherein the fan is mounted on top of the heat sink.

FIG. 5 illustrates another modified embodiment of the cooler in accordance with the present invention, wherein the heat-dissipating fan 20 is attached on top of the fins 11 for driving air vertically downward. The air is then guided by the upper side of the base 10 to flow along the respective air channel 12 and then exit the ends of the respective air channel 12. The non-rectilinear air channels 12 allows sufficient heat-exchange between the fins 11 and the air passing through the air channels 12. The bending portions of the non-rectilinear air channels 12 retard the air and thus increase the time for air to pass through the air channels 12. The heat-exchange efficiency for the airflow in the respective air channel 12 is effectively improved, resulting an improvement in the overall heat-exchange efficiency of the heat sink.

Figure 6:
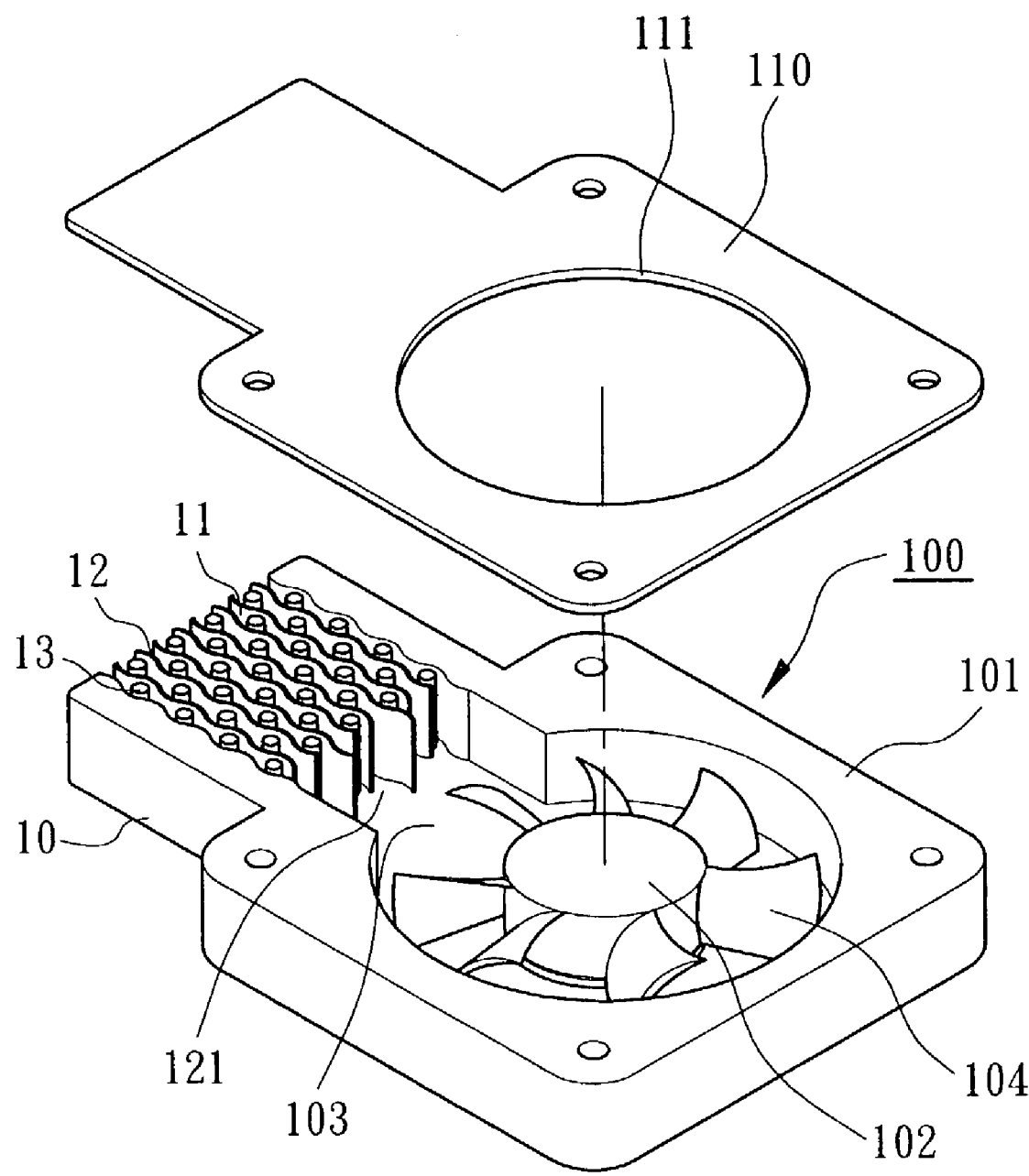
FIG. 6 is a perspective view, partly exploded of a cooler incorporating another embodiment of the heat sink in accordance with the present invention.
Figure 7:
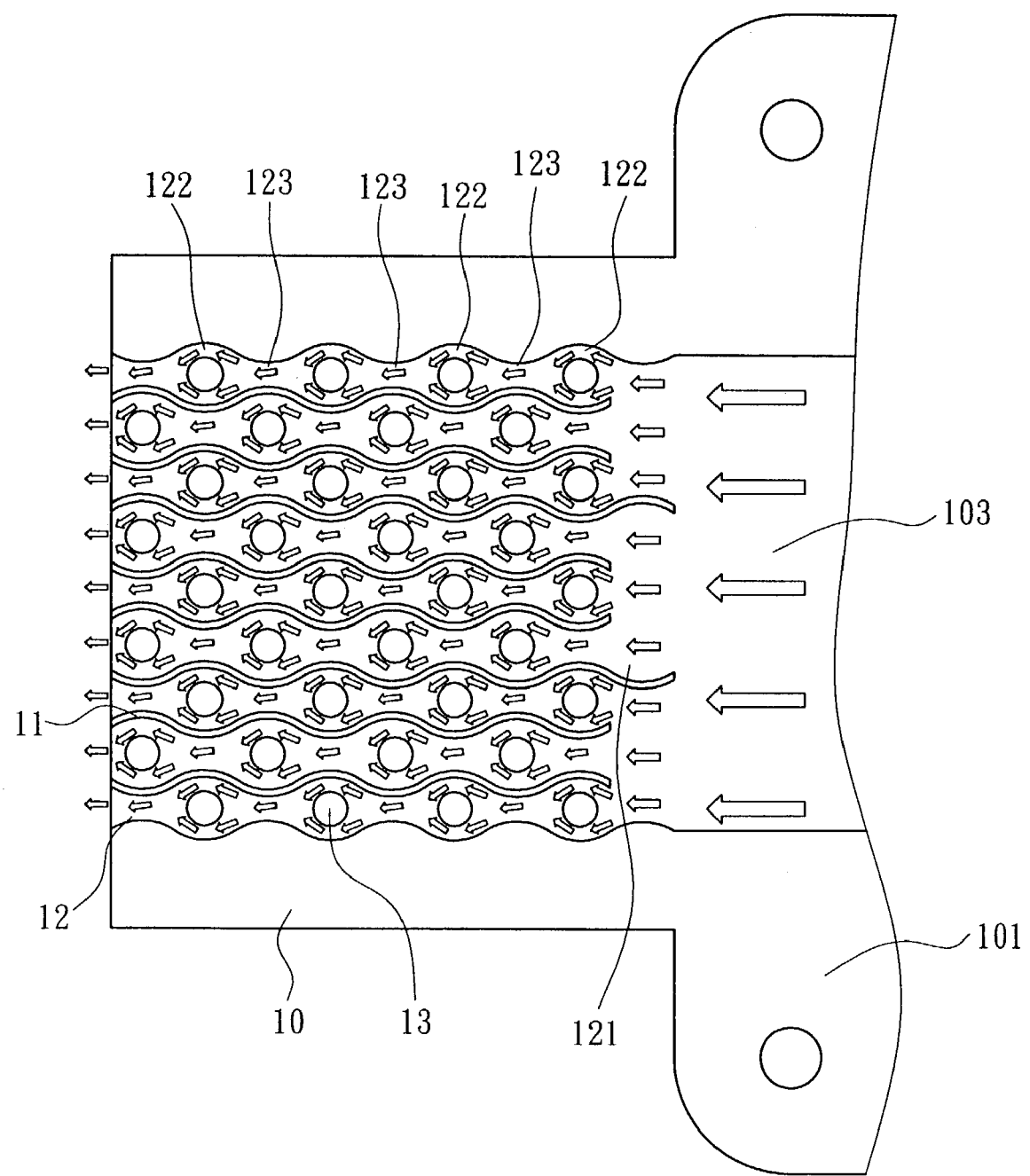
FIG. 7 is schematic top view illustrating airflow of the cooler in FIG. 6.

FIG. 6 is a perspective view, partly exploded of a cooler incorporating another embodiment of the heat sink in accordance with the present invention. FIG. 7 is schematic top view illustrating airflow of the cooler in FIG. 6. In this embodiment, the fins 11 are configured to form a non-rectilinear air channel 12 between each two adjacent fins 1, with each air channel 12 having a plurality of relatively wider sections 122 and a plurality of relatively narrower sections 123 that are alternately disposed along an extending direction of the respective air channel 12. Namely, each fin 11 is in the form of a sine wave, and each fin 11 has a phase difference of 90 degrees with its adjacent fin 11. Further, a heat-dissipating peg 13 is formed in a central portion of each relatively wider section 122 of the respective air channel 12. The heat-dissipating pegs 13 increase the overall heat-exchange area of the heat sink and thus provides heat-exchange effect at the bending portions of the fins 11 and the heat-dissipating pegs 13, which further improves the overall heat-dissipating efficiency. Further, some of the fins 11 may be shorter, forming at least one wider air guide section 121 adjacent to the outlet 103 of the casing 101, as shown in FIG. 7. Thus, the air flows more smoothly from the outlet 103 into the non-rectilinear air channels 12. It is noted the heat-dissipating fan can be attached to the heat sink in a manner similar to that in FIG. 4 or FIG. 5.

Figure 8:
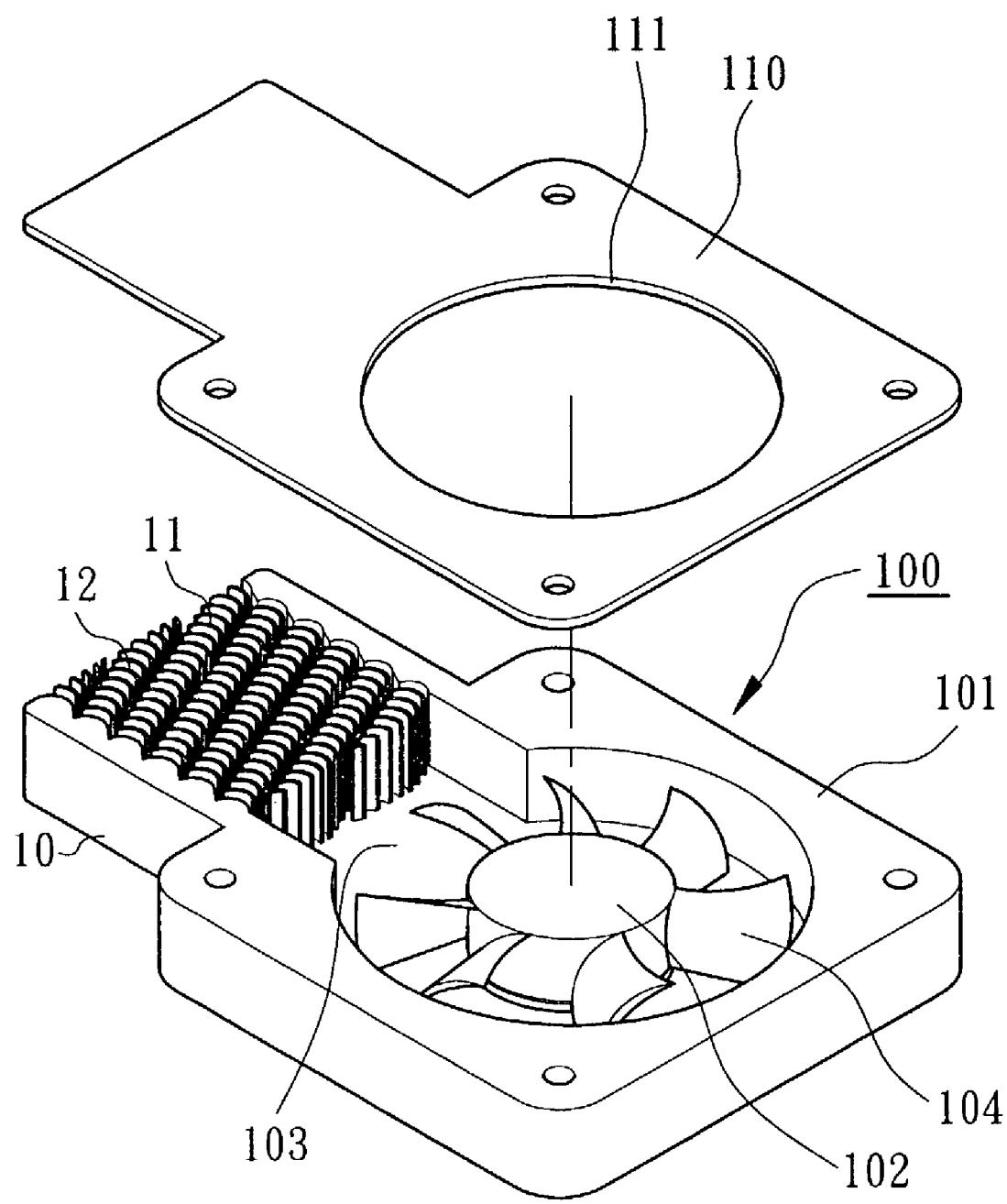
FIG. 8 is a perspective view, partly exploded of a cooler incorporating a further embodiment of the heat sink in accordance with the present invention.
Figure 9:
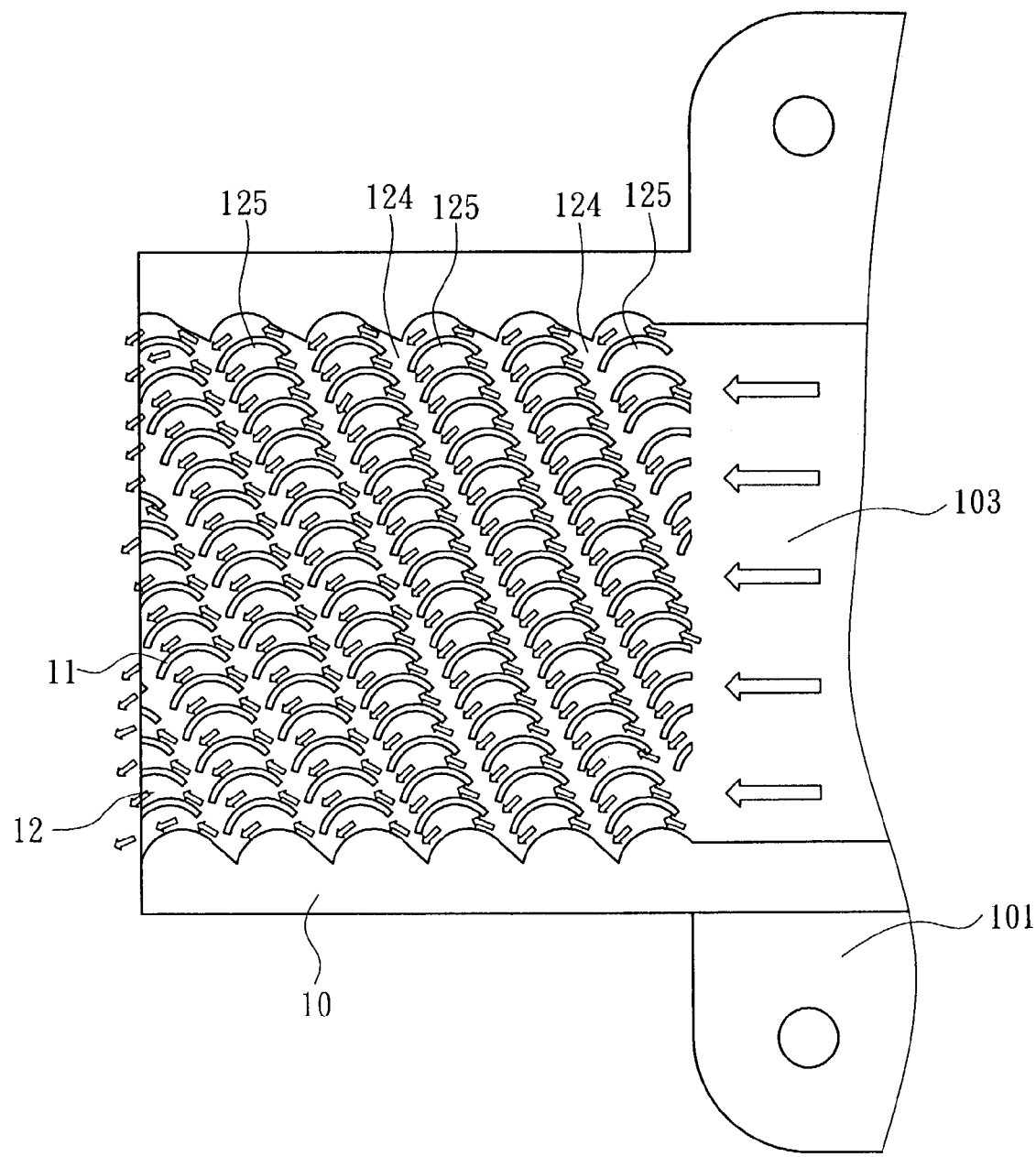
FIG. 9 is schematic top view illustrating airflow of the cooler in FIG. 8.

FIG. 8 is a perspective view, partly exploded of a cooler incorporating a further embodiment of the heat sink in accordance with the present invention. FIG. 9 is schematic top view illustrating airflow of the cooler in FIG. 8. In this embodiment, each fin 11 is discontinuous (see the gap 124) and comprised of a plurality of arc-shaped sections 125. As shown in FIG. 9, all of the arc-shaped sections 125 on the upper side of the base 10 form a plurality of rows of arc-shaped sections 125, with the gap 124 being located between each two adjacent rows of arc-shaped sections 125. Further, each row of arc-shaped sections 125 extends along a direction that is at an acute angle with the extending direction of the respective air channel 12. Since the fins 11 are discontinuous, the air channels 12 are communicated with one another. The heat-exchange between the air and the fins 11 is improved, thereby improving the overall heat-dissipating efficiency of the heat sink. As illustrated in FIG. 9, preferably, the heat sink is integrally formed on the outlet 103 side of the heat-dissipating fan 100. Further, some of the fins 11 may be shorter, forming at least one wider air guide section 121 adjacent to the outlet 103 of the casing 101. Thus, the air flows more smoothly from the outlet 103 into the non-rectilinear air channels 12. It is noted the heat-dissipating fan can be attached to the heat sink in a manner similar to that in FIG. 4 or FIG. 5.

Figure 10:
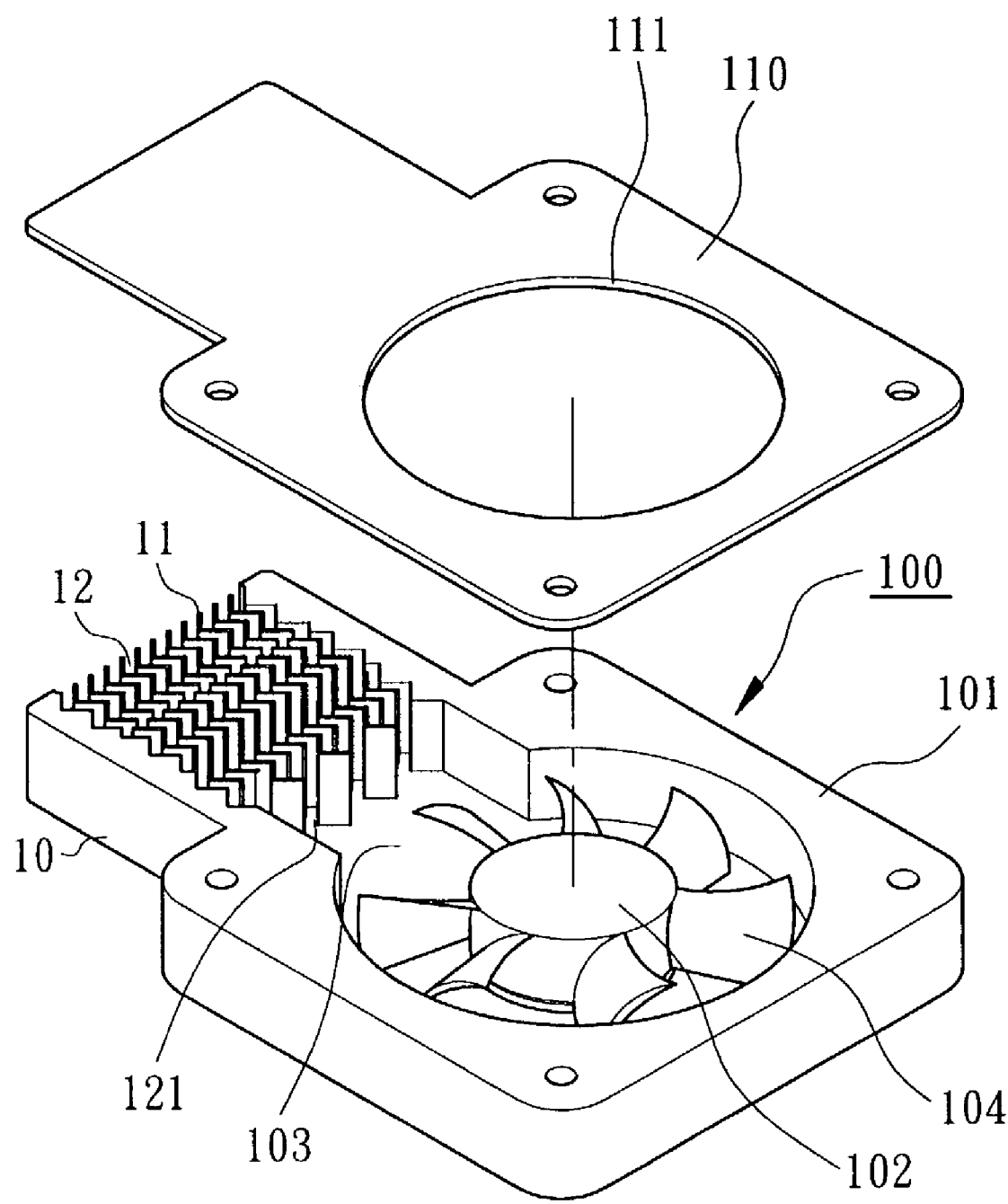
FIG. 10 is a perspective view, partly exploded of a cooler incorporating still another embodiment of the heat sink in accordance with the present invention.
Figure 11:
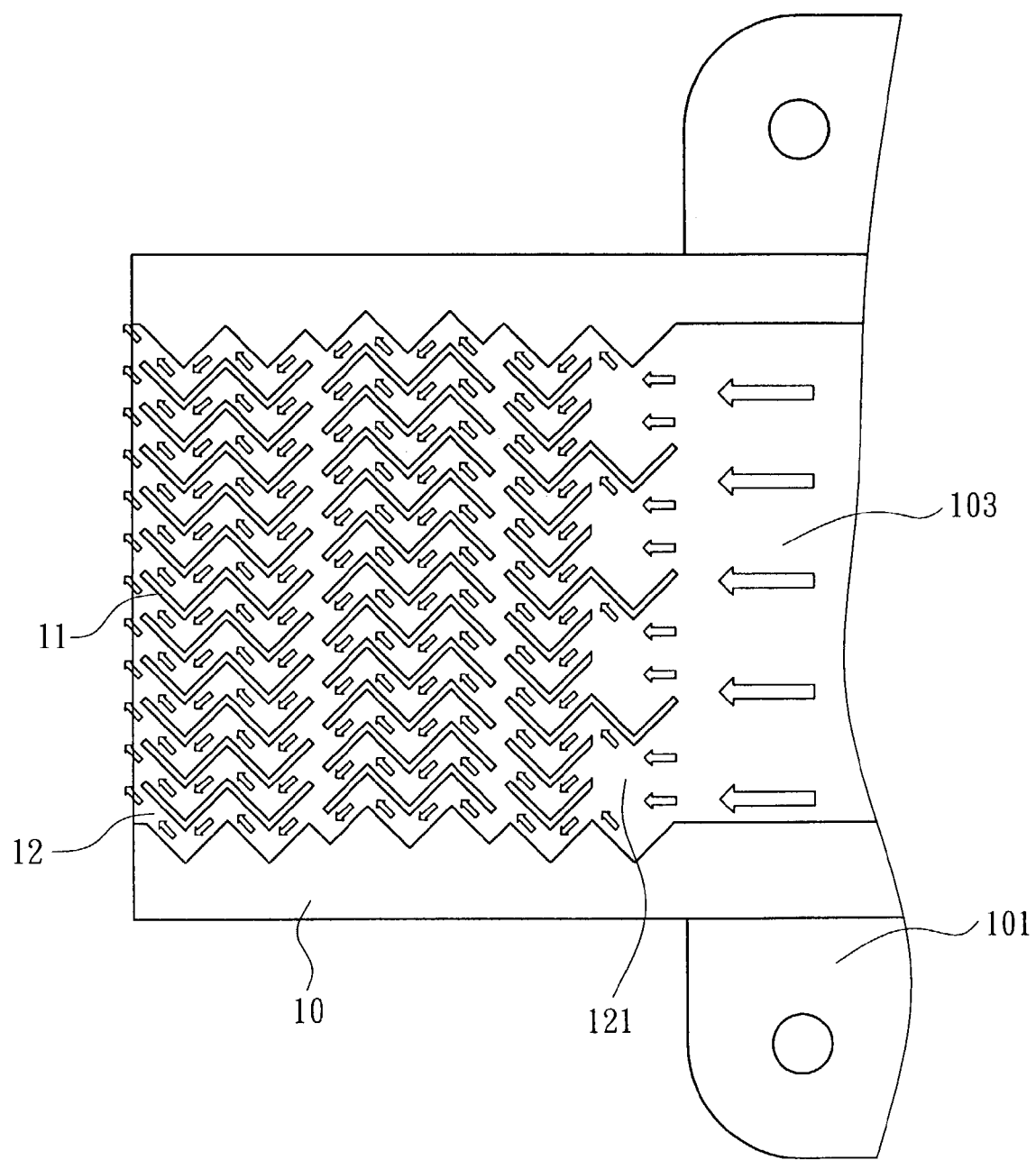
FIG. 11 is schematic top view illustrating airflow of the cooler in FIG. 10.
Figure 12:
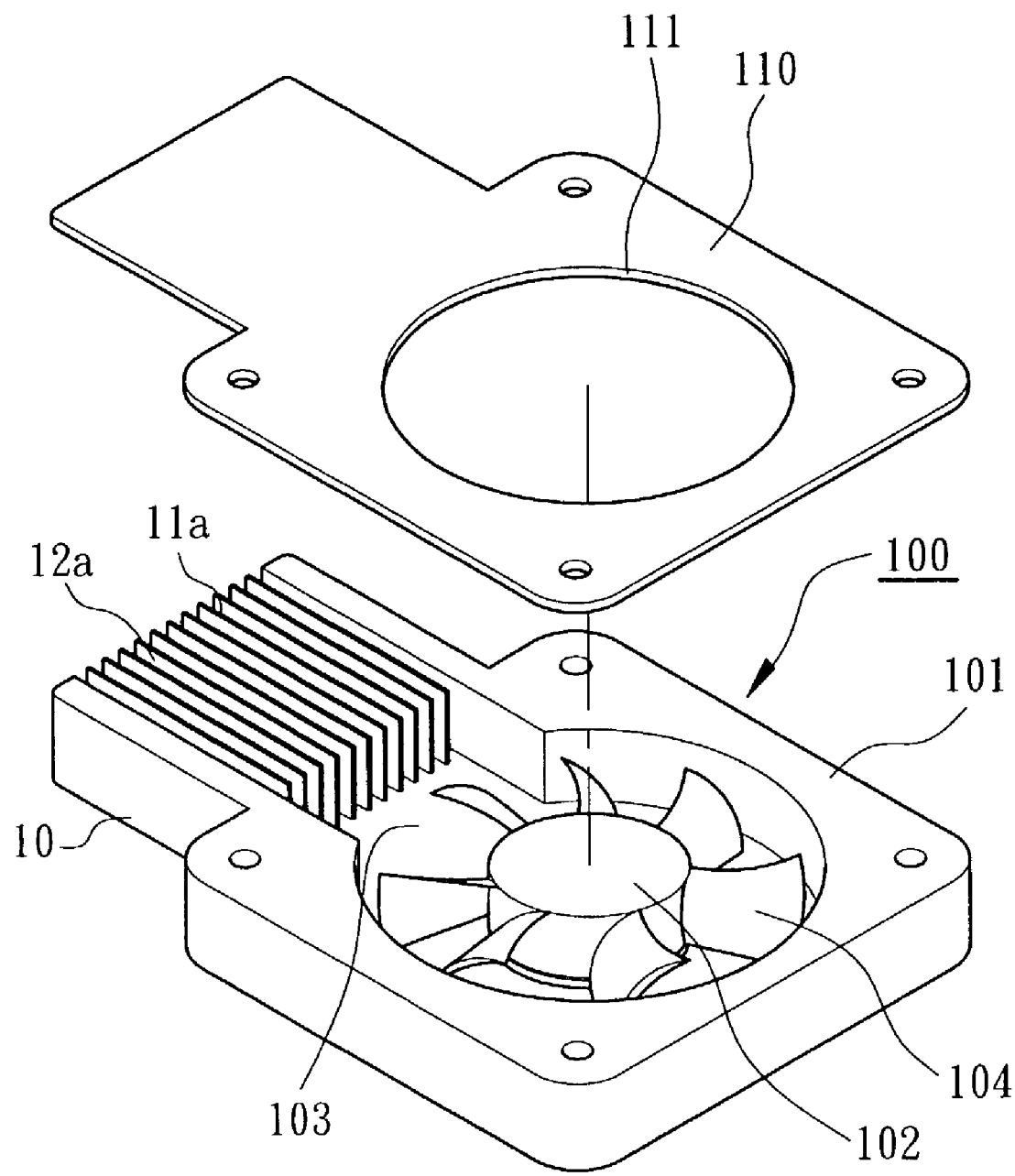
FIG. 12 is a perspective view, partly exploded, of a conventional cooler.
Figure 13:
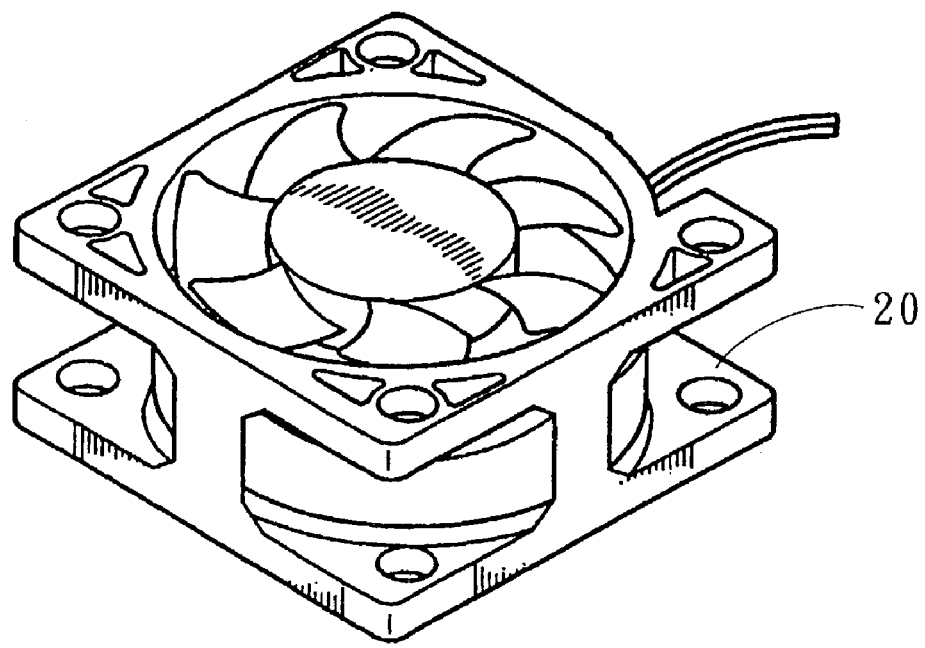
FIG. 13 is an exploded perspective view of another conventional cooler.
Figure 13:
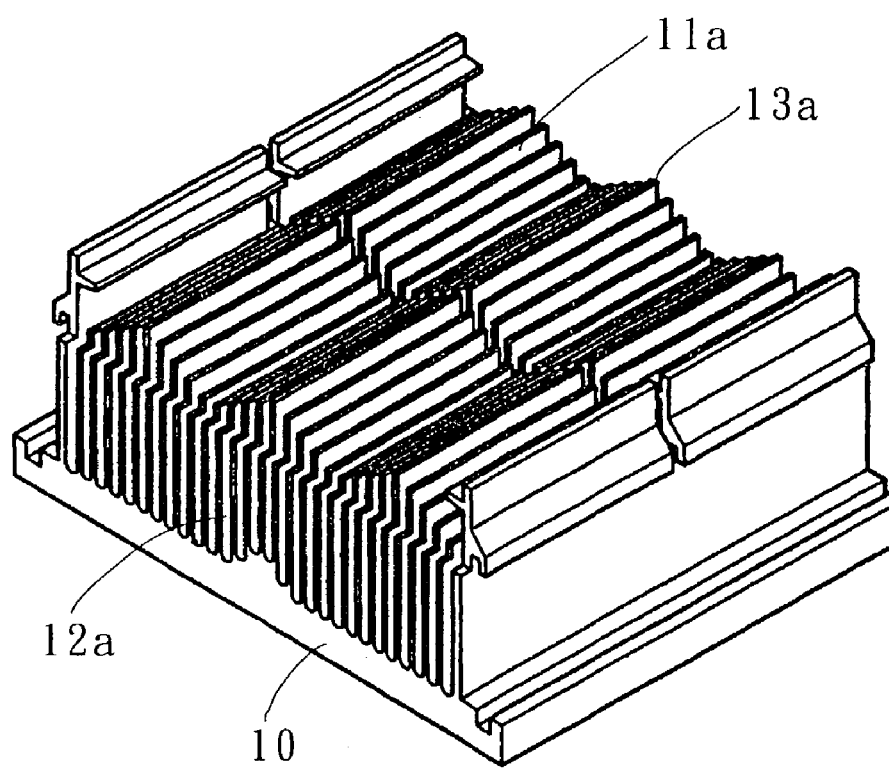

FIG. 10 is a perspective view, partly exploded of a cooler incorporating still another embodiment of the heat sink in accordance with the present invention. FIG. 11 is schematic top view illustrating airflow of the cooler in FIG. 10. Unlike the above embodiments, each fin 11 in this embodiment is zigzag. As shown in FIG. 11, each fin 11 is discontinuous and comprised of a plurality of sections that are W-shaped, M-shaped, or V-shaped. The number of the sections can be changed according to need, thereby changing the communication between the air channels 12. Since the fins 11 are discontinuous, the air channels 12 are communicated with one another. The heat-exchange between the air and the fins 11 is improved, thereby improving the overall heat-dissipating efficiency of the heat sink. As illustrated in FIG. 11, preferably, the heat sink is integrally formed on the outlet 103 side of the heat-dissipating fan 100. Further, some of the fins 11 may be shorter, forming at least one wider air guide section 121 adjacent to the outlet 103 of the casing 101. Thus, the air flows more smoothly from the outlet 103 into the non-rectilinear air channels 12. It is noted the heat-dissipating fan can be attached to the heat sink in a manner similar to that in FIG. 4 or FIG. 5.

It is noted that the spacing between the fins 11 in the embodiments of FIGS. 4–11 can be at regular or irregular intervals. The fins 11 in the embodiments of FIGS. 1–9 can be zigzag, and the fins in the embodiments of FIGS. 10–11 can be wavy or arc-shaped.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A heat sink, comprising:
a base having a first side adapted to be in contact with a heat-generating electronic element and a second side opposed to the first side, said base including a pair of side walls each having a non-flat waveform surface, said side walls projecting upwardly from the base and having a first thickness;
a set of fins formed on the second side of the base, each of said fins having a second thickness being less than said first thickness of the side wall, said fins disposed between said side walls of the base and each said non-flat waveform surface of said side walls facing at least one of said fins for increasing an area of heat-dissipation; and
a non-rectilinear air channel being formed between two of the fins adjacent to each other and between each said non-flat waveform surface of said side walls and one of said fins, with a length of the non-rectilinear air channel being greater than a length of the base along an extending direction of the fins on the base; and
a heat dissipating fan being attached to a side of the base to form a cooler for driving air from an end of the respective air channel through another end of the respective air channel.

2. The heat sink as claimed in claim 1, wherein the fins are wavy.

3. The heat sink as claimed in claim 1, wherein the fins are zigzag.

4. The heat sink as claimed in claim 1, wherein the fins are spaced at regular intervals.

5. The heat sink as claimed in claim 1, wherein the fins are spaced at irregular intervals.

6. The heat sink as claimed in claim 1, wherein the fins are continuous.

7. The heat sink as claimed in claim 1, wherein the fins are discontinuous and the air channels are communicated with one another.

8. The heat sink as claimed in claim 2, wherein each said air channel includes a plurality of relatively wider sections and a plurality of relatively narrower sections, further including a heat-dissipating peg formed in each said relatively wider section.

9. The heat sink as claimed in claim 8, wherein the relatively wider sections and the relatively narrower sections are alternately disposed.

10. The heat sink as claimed in claim 9, wherein the heat-dissipating peg is located in the central portion of the respective relatively wider section.

11. The heat sink as claimed in claim 7, wherein each said fin includes a plurality of arc-shaped sections.

12. The heat sink as claimed in claim 11, wherein the arc-shaped sections of the fins form a plurality of rows of arc-shaped sections, with a gap being defined between two adjacent rows of arc-shaped sections.

13. The heat sink as claimed in claim 11, wherein each of said plurality of arc-shaped sections extends along a direction that is at an acute angle with the extending direction of the respective air channel.

14. The heat sink as claimed in claim 1, further comprising a heat-dissipating fan being mounted on top of the heat sink to form a cooler for vertically driving air downward, with the air exiting the respective air channel via two ends of the respective air channel.

15. The heat sink as claimed in claim 1, wherein some of said fins are shorter than the remaining fins to provide at least one wider air guide section, said air guide section has an opening and an orientation thereof mis-aligning with a longitudinal direction of an incoming air flow inlet of the base.

16. A cooler comprising:
a heat-dissipating fan including a casing having an outlet, a fan wheel being rotatably mounted in the casing;
a heat sink including a base integrally formed with the casing, said base including a pair of side walls each having an non-flat waveform surface, said side walls projecting upwardly from the base and having a first thickness, a set of fins being formed on a side of the base, each of said fins having a second thickness being less than said first thickness of the side wall, said fins disposed between said side walls and each said non-flat waveform surface of said side walls facing at least one of said fins for increasing an area of heat-dissipation;
a lid mounted on top of the casing and the fins, the lid including an inlet; and
a non-rectilinear air channel being formed between two of the fins adjacent to each other and between each said non-flat waveform surface of said side walls and one of said fins, with a length of the non-rectilinear air channel being greater than a length of the base along an extending direction of the fins on the base;
wherein air is driven into the casing via the inlet of the lid, passes through the outlet of the casing, and then exits the fin after passing through the respective air channel.

17. The cooler as claimed in claim 16, wherein the fins are wavy, each said air channel including a plurality of relatively wider sections and a plurality of relatively narrower sections that are alternately disposed, further including a heat-dissipating peg formed in a central portion of each said relatively wider section.

18. The cooler as claimed in claim 16, wherein the fins are zigzag and discontinuous with the air channels being communicated with one another, the arc-shaped sections of the fins forming a plurality of rows of arc-shaped sections, with a gap being defined between two adjacent rows of arc-shaped sections.

19. The cooler as claimed in claim 18, wherein each of said plurality of arc-shaped sections extends along a direction that is at an acute angle with the extending direction of the respective air channel.

20. The cooler as claimed in claim 16, wherein some of said fins are shorter than the remaining fins to provide at least one wider air guide section, said air guide section has an opening and an orientation thereof mis-aligning with a longitudinal direction running along the air outlet of the casing.

* * * * *